(12) United States Patent
Nakamura

(10) Patent No.: US 11,519,865 B2
(45) Date of Patent: Dec. 6, 2022

(54) CRACK DETECTION METHOD

(71) Applicant: DISCO CORPORATION, Tokyo (JP)

(72) Inventor: Masaru Nakamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 16 days.

(21) Appl. No.: 17/173,419

(22) Filed: Feb. 11, 2021

(65) Prior Publication Data

US 2021/0270749 A1 Sep. 2, 2021

(30) Foreign Application Priority Data

Feb. 28, 2020 (JP) .............................. JP2020-032994

(51) Int. Cl.
*G01N 21/91* (2006.01)
*G01N 21/88* (2006.01)

(52) U.S. Cl.
CPC ......... *G01N 21/91* (2013.01); *G01N 21/8803* (2013.01)

(58) Field of Classification Search
CPC .............. G01N 21/91; G01N 21/8803; G01N 21/9505; G01N 21/9501; G01N 21/958; G01N 21/88; G01N 21/9503; G01N 21/896; G01N 2203/0064; G01N 2203/0066; G01M 5/0033; H01L 21/67288
USPC .......................................... 356/237.1–237.5
See application file for complete search history.

(56) References Cited

U.S. PATENT DOCUMENTS

| | | | | |
|---|---|---|---|---|
| 2,636,127 A | * | 4/1953 | De Forest | G01N 21/91 73/104 |
| 8,108,998 B2 | * | 2/2012 | Inada | B23K 26/0853 438/460 |
| 2020/0111710 A1 | * | 4/2020 | Nakamura | B24B 7/228 |

FOREIGN PATENT DOCUMENTS

| | | | |
|---|---|---|---|
| CN | 109738548 A | | 5/2019 |
| JP | 11211675 | * | 8/1999 |
| JP | 2002192370 A | | 7/2002 |
| JP | 2005184032 A | | 7/2005 |
| JP | 2016068392 A | | 5/2016 |

OTHER PUBLICATIONS

Search report issued in corresponding Singapore patent application No. 10202101533W, dated Dec. 20, 2021.

* cited by examiner

*Primary Examiner* — Hoa Q Pham
(74) *Attorney, Agent, or Firm* — Greer Burns & Crain Ltd.

(57) ABSTRACT

A crack detection method includes a crack forming step of applying a laser beam to a plate-shaped workpiece that has a first side and a second side opposite to the first side linearly from the first side with a focal point of the laser beam positioned inside the workpiece, the laser beam being of a wavelength having a transmitting property to the workpiece, to thereby form a modified layer inside the workpiece and further form a crack extending from the modified layer toward the second side, a coating material applying step of applying a coating material to the second side, and a crack detecting step of detecting the crack by searching for a portion where the coating material is linearly repelled.

7 Claims, 5 Drawing Sheets

CRACK DETECTION METHOD

BACKGROUND OF THE INVENTION

Field of the Invention

The present invention relates to a crack detection method for detecting a crack formed together with a modified layer in a workpiece by applying a laser beam of a wavelength having a transmitting property to the workpiece.

Description of the Related Art

A wafer, which has a front side partitioned by a plurality of crossing division lines into a plurality of regions where respective devices such as integrated circuits (ICs) and large-scale integrated circuits (LSIs) are formed, is applied with a laser beam of a wavelength having a transmitting property to the wafer with a focal point of the laser beam being positioned inside the wafer along the division lines to thereby form modified layers, so that the wafer is divided into individual device chips (refer to Japanese Patent No. 3408805, for example).

Further, there is proposed a technology of holding, after the modified layers are formed inside the wafer along the division lines, the wafer on a chuck table of a grinding apparatus such that the front side of the wafer to which a protective tape has been attached faces downward, and grinding a back side of the wafer to thin the wafer, to thereby divide the wafer into individual device chips (refer to Japanese Patent No. 4358762, for example).

SUMMARY OF THE INVENTION

In the technology disclosed in Japanese Patent No. 4358762, by beforehand forming the modified layers inside the wafer along the division lines and also forming cracks extending from the modified layers to reach the front side of the wafer, the wafer is favorably divided into individual device chips when the wafer is thinned by the grinding apparatus. However, in the case where the cracks extending from an area where the modified layers are formed do not reach the side of the wafer opposite to the side to which the laser beam has been applied, it is difficult to smoothly divide the wafer into individual device chips. Therefore, laser processing conditions for forming the modified layers by a laser processing apparatus are adjusted and determined so as to form the modified layers inside the wafer along the division lines and to assuredly form the cracks extending from the modified layers to reach the front side of the wafer.

The laser processing conditions described above need to be adjusted every time a material, a thickness, or the like of the wafer changes. At the time of such adjustment, a microscope is required to be used in order to check whether or not the cracks extending from the modified layers formed inside the wafer are exposed on the side opposite to the side to which the laser beam has been applied, i.e., whether or not the cracks have appropriately been formed, which may lead to poor productivity.

Accordingly, it is an object of the present invention to provide a crack detection method that, when modified layers are formed inside a workpiece by applying a laser beam of a wavelength having a transmitting property to the workpiece, makes it possible to easily detect that cracks have appropriately been formed.

In accordance with an aspect of the present invention, there is provided a crack detection method including a crack forming step of applying a laser beam to a plate-shaped workpiece that has a first side and a second side opposite to the first side linearly from the first side with a focal point of the laser beam positioned inside the workpiece, the laser beam being of a wavelength having a transmitting property to the workpiece, to thereby form a modified layer inside the workpiece and further form a crack extending from the modified layer toward the second side; a coating material applying step of applying a coating material to the second side after the crack forming step is performed; and a crack detecting step of detecting the crack by searching for a portion where the coating material is linearly repelled.

Preferably, an oil-based marker is used in the coating material applying step.

According to the present invention, it is possible to easily check whether or not the cracks have appropriately been formed without using a microscope or the like and to immediately adjust laser processing conditions so as to form appropriate cracks, which improves the productivity.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A crack detection method according to an embodiment of the present invention will be described in detail below with reference to the attached drawings. It is to be noted that a crack detection method for checking whether or not cracks have appropriately been formed inside a plate-shaped workpiece and a subsequent method for performing processing to divide a wafer having the same material and size as those of the workpiece into individual device chips are described below in order.

First, in the crack detection method according to the embodiment of the present invention, there is prepared a workpiece 10A (a dummy wafer), for detecting cracks, formed so as to have the same material (silicon (Si), for example) and size (a diameter of 300 mm and a thickness of 780 μm) as those of a plate-shaped wafer to be divided into individual device chips. It is to be noted that the workpiece 10A has nothing formed on a first side 10Aa and a second side 10Ab thereof.

Figure 1:
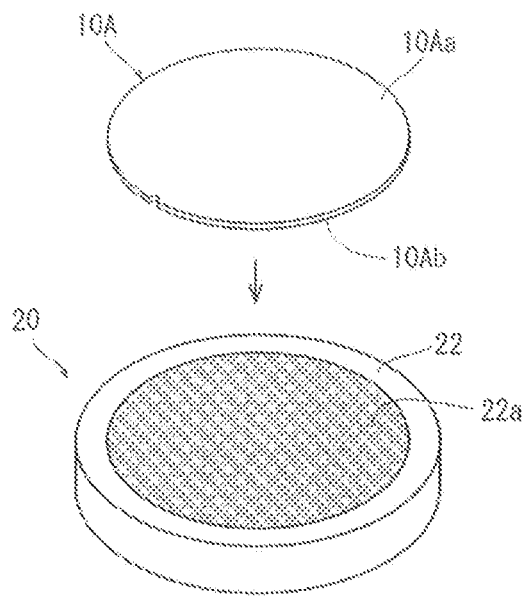
FIG. 1 is a perspective view illustrating a manner in which a plate-shaped workpiece is placed on a chuck table of a laser processing apparatus.

The plate-shaped workpiece 10A thus prepared is placed on a holding surface 22a of a chuck table 22 of a laser processing apparatus 20 partially illustrated in FIG. 1 such that the first side 10Aa faces upward and the second side 10Ab faces downward, and suction means not illustrated is operated to hold the workpiece 10A under suction on the chuck table 22.

Figure 2A:
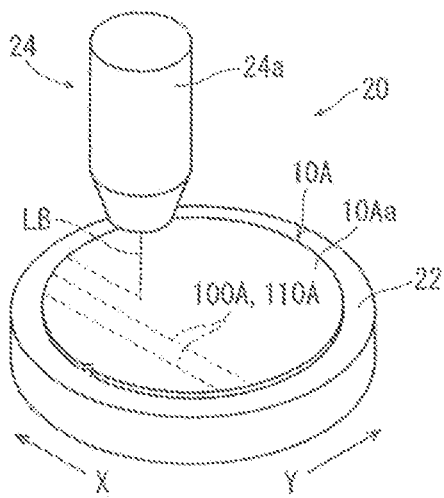
FIG. 2A is a perspective view illustrating a manner in which a crack forming step is performed.

After the workpiece 10A is held on the chuck table 22 in the above-described manner, the workpiece 10A is moved together with the chuck table 22 to a position directly below focusing means 24a of a laser beam applying unit 24 of the laser processing apparatus 20 as illustrated in FIG. 2A. It is to be noted that, in this case, an alignment step may be performed as needed so as to accurately detect a position to be processed in the workpiece 10A.

Figure 2B:
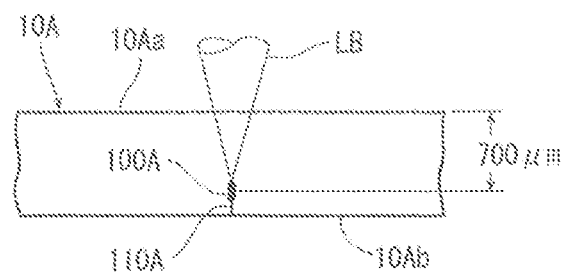
FIG. 2B is a partially enlarged sectional view of the workpiece when the crack forming step is being performed.

A focal point of a laser beam LB applied from the laser beam applying unit 24 is then positioned at a position inside the workpiece 10A corresponding to a depth of 700 μm from the first side 10Aa that constitutes an upper surface of the workpiece 10A as illustrated in FIG. 2B. With the focal point positioned at the position, the chuck table 22 is processing-fed in an X-axis direction indicated by an arrow X while, at the same time, the laser beam applying unit 24 is operated to apply the laser beam LB linearly to the workpiece 10A, to thereby form a modified layer 100A and a crack 110A extending from the modified layer 100A toward the second side 10Ab inside the workpiece 10A (refer to FIG. 2B). It is to be noted that, in the present embodiment, the laser beam LB is linearly applied to the workpiece 10A three times while shifting the position to which the laser beam LB is applied in a Y-axis direction indicated by an arrow Y as illustrated in FIG. 2A, thereby forming three processed lines in the workpiece 10A. A crack forming step is then completed.

It is to be noted that the laser processing described above is performed, for example, under the following laser processing conditions.

Wavelength: 1342 nm
Repetition frequency: 90 kHz
Average output: 1.1 W
Processing-feed speed: 700 mm/s Although, in FIG. 2A, the modified layers 100A and the cracks 110A formed in the workpiece 10A are indicated by broken lines for convenience of explanation, it is actually not possible to visually recognize the modified layers 100A and the cracks 110A from either the first side 10Aa or the second side 10Ab. Therefore, a crack detecting step to be described below with reference to FIGS. 3A to 3C is performed.

Figure 3A:
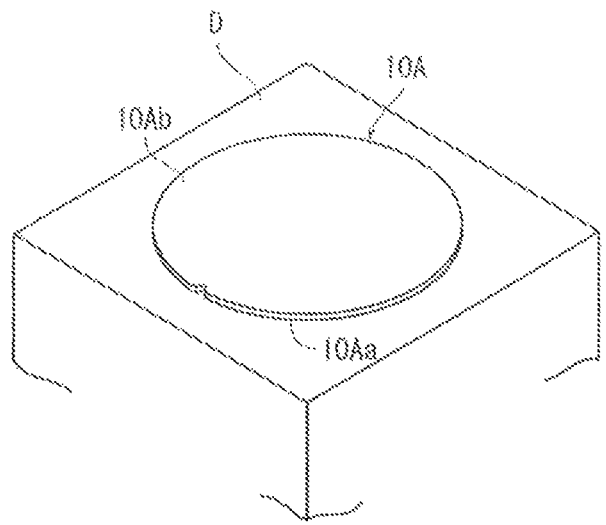
FIG. 3A is a perspective view illustrating a manner in which the workpiece is placed on a test base used when a crack detecting step is performed.

The workpiece 10A that has undergone the crack forming step as described above is unloaded from the laser processing apparatus 20, transferred to a test base D for detecting cracks illustrated in FIG. 3A, and placed on the test base D such that the first side 10Aa faces downward and the second side 10Ab faces upward. After the workpiece 10A is placed on the test base D, a colored coating material is applied to a region P that includes portions where the modified layers 100A and the cracks 110A are formed by the crack forming step, on the second side 10Ab. Although the method for applying the coating material is not specifically limited, the present inventors have found that the coating material can suitably be applied to the second side 10Ab of the workpiece 10A by using an oil-based black or red marker pen M as illustrated in FIG. 3B. It is to be noted that the oil-based marker pen M used in application of the coating material in the present embodiment is not specifically limited in thickness, and the marker pen M may be a pen that is generally called a felt-tip pen. Further, the coating material actually applied is not specifically limited to the oil-based colored coating material, and an acrylic coating material, an india ink, or the like may otherwise be used.

Figure 3B:
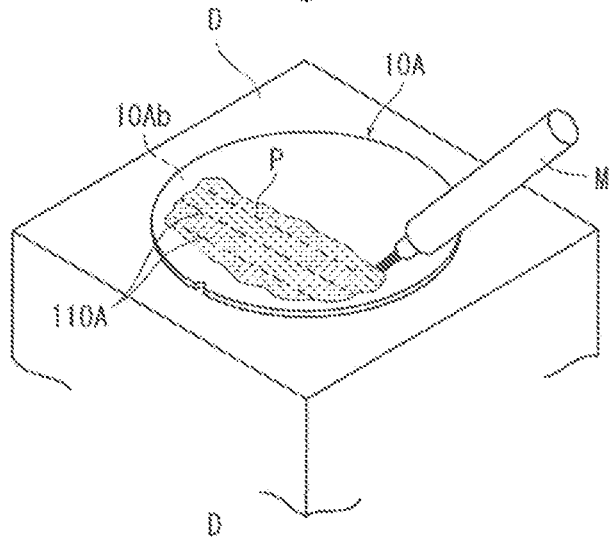
FIG. 3B is a perspective view illustrating a state in which a coating material is applied to a second side of the workpiece having cracks insufficiently formed therein.
Figure 3C:
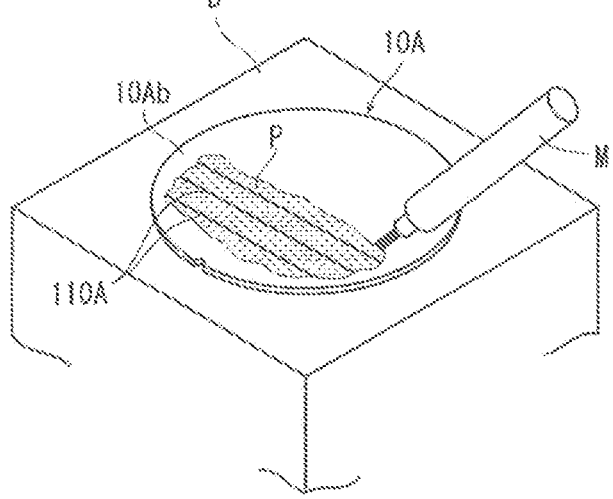
FIG. 3C is a perspective view illustrating a state in which the coating material is applied to a second side of the workpiece having cracks sufficiently formed therein.

Here, as illustrated in FIG. 3B, when the region P where the coating material have been applied is searched (crack detecting step), it is easy to visually detect a line indicating the presence of a crack 110A in a portion where the crack 110A reaches the second side 10Ab since the coating material is linearly repelled in the portion, while it is not possible to detect a line in a portion where a crack 110A does not reach the second side 10Ab since the coating material is not repelled in the portion. Therefore, if lines indicating the cracks 110A do not continuously appear and the coating material is repelled intermittently as illustrated in FIG. 3B, it is recognized that the formation of the cracks 110A is insufficient.

If it is recognized that the formation of the cracks 110A is insufficient as described above, the laser power (average output) in the laser processing conditions described above is adjusted. In the present embodiment, for example, the average output of 1.1 W set in the laser processing conditions described above is adjusted to 1.2 W, the crack forming step described above is performed again, and the coating material is applied to the second side 10Ab to perform the crack detecting step again. In the case where the cracks 110A suitably reach the second side 10Ab over the entire region having been applied with the laser beam LB, continuous lines appear without intermittence in the region P where the coating material is applied, as illustrated in FIG. 3C. In this case, it is confirmed that the laser processing conditions are appropriate, and a plate-shaped workpiece (wafer) is processed in the following manner under the laser processing conditions.

After the crack detection method described above is performed to determine the laser processing conditions, a wafer processing method for dividing a wafer, having a front side partitioned by a plurality of crossing division lines into a plurality of regions where respective devices are formed, into individual device chips is performed by use of a laser processing apparatus in the following manner.

Figure 4:
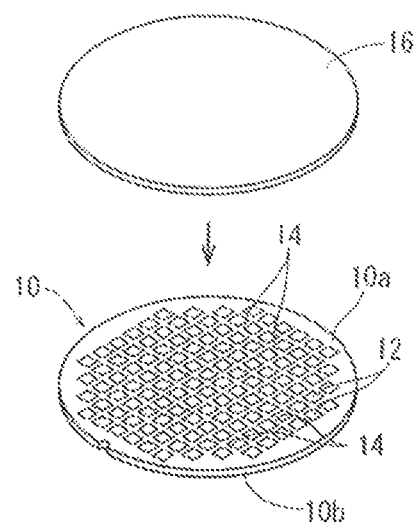
FIG. 4 is a perspective view illustrating a manner in which a protective tape is attached to a wafer.

The workpiece to be processed by the wafer processing method according to the present embodiment is a wafer 10 illustrated in FIG. 4, for example. The wafer 10 includes the same material (Si) as that of the plate-shaped workpiece 10A used when the crack detection method described above is performed, and has the same size (a diameter of 300 mm and a thickness of 780 μm) as that of the workpiece 10A. The wafer 10 has a front side 10a partitioned by a plurality of crossing division lines 14 into a plurality of regions where respective devices 12 are formed.

After the wafer 10 described above is prepared, a protective member having the same outside diameter as that of the wafer 10 and having an adhesive layer formed on a front side thereof, such as a protective tape 16 including polyvinyl chloride (PVC), polyethylene terephthalate (PET), or the like, is attached to the front side 10a of the wafer 10 as illustrated in FIG. 4, to thereby obtain an integral unit. It is to be noted that the protective tape 16 is not limited to the protective member having the adhesive layer formed on the front side thereof, and a thermocompression bonding sheet having no adhesive layer and including polyolefin, polyester, or the like may be adopted as the protective tape 16, for example.

Figure 5A:
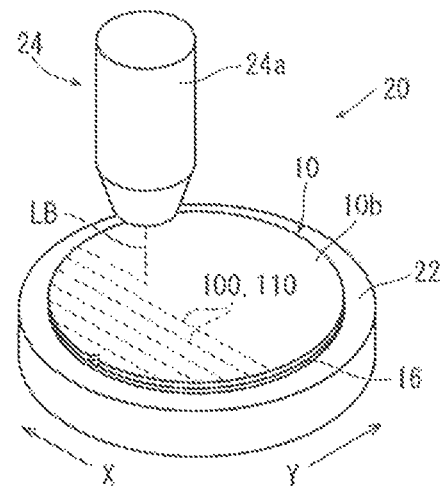
FIG. 5A is a perspective view illustrating a manner in which a modified layer forming step is performed.

The wafer 10 with the protective tape 16 attached thereto is then transferred to a laser processing apparatus 20 partially illustrated in FIG. 5A to perform a modified layer forming step. It is to be noted that the laser processing apparatus 20 here is the same as the laser processing apparatus 20 used in performing the crack detection method described earlier.

Figure 5B:
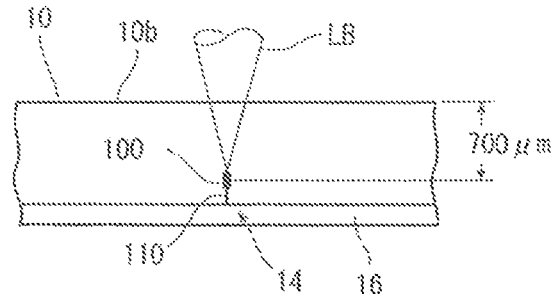
FIG. 5B is a partially enlarged sectional view of the wafer when the modified layer forming step is being performed.

In performing the modified layer forming step according to the present embodiment, as illustrated in FIG. 5A, the wafer 10 is placed on the chuck table 22 of the laser processing apparatus 20 such that a back side 10b of the wafer 10 faces upward and the protective tape 16 faces downward, and suction means not illustrated is operated to hold the wafer 10 under suction on the chuck table 22. After an alignment step is suitably performed to detect the division lines 14 formed on the front side 10a of the wafer 10 by use of infrared rays, the wafer 10 held on the chuck table 22 is positioned directly below the focusing means 24a of the laser beam applying unit 24. A processing start position of predetermined one of the division lines 14 of the wafer 10 is then moved to a position to which the laser beam LB is applied from the focusing means 24a, with the focal point of the laser beam LB positioned inside the wafer 10 along the division line 14 at a position corresponding to a depth of 700 µm from the back side 10b as illustrated in FIG. 5B. It is to be noted that the position of the focal point here is the same as the position of the focal point set in the crack forming step performed in the crack detection method.

Then, while the chuck table 22 is moved in an X-axis direction indicated by an arrow X in FIG. 5A, the laser beam applying unit 24 is operated to apply the laser beam LB, thereby forming a modified layer 100 inside the wafer 10 along the division line 14.

It is to be noted that the laser processing described above is performed, for example, under the following laser processing conditions.

Wavelength: 1342 nm
Repetition frequency: 90 kHz
Average output: 1.2 W
Processing-feed speed: 700 mm/s As described above, it has been confirmed by the crack detection method that, under the laser processing conditions, cracks are favorably formed when modified layers are formed inside a wafer. Therefore, when the modified layer 100 is formed inside the wafer 10, a crack 110 is formed so as to extend from the modified layer 100 and reach the division line 14 on the front side 10a of the wafer 10.

After the modified layer 100 and the crack 110 are formed along the predetermined division line 14, the chuck table 22 is moved (index-fed) in a Y-axis direction indicated by an arrow Y in FIG. 5A, an unprocessed division line 14 adjacent the predetermined division line 14 is positioned to the position to which the laser beam LB is applied, and the laser beam LB is applied in the same manner as described above, thereby forming a modified layer 100 and a crack 110 inside the wafer 10 along the division line 14. The laser processing is similarly performed along all the division lines 14 extending in parallel to the predetermined division line 14, so that modified layers 100 and cracks 110 are formed inside the wafer 10 along the respective division lines 14. The chuck table 22 holding the wafer 10 thereon is then rotated by 90 degrees, and the laser processing is similarly performed along all the division lines 14 extending in a direction orthogonal to the predetermined division line 14, thereby forming respective modified layers 100 and cracks 110 (refer to FIG. 6A). The modified layer forming step is then completed. It is to be noted that, although the modified layers 100 and the cracks 110 in the wafer 10 illustrated are indicated by broken lines for convenience of explanation, it is actually not possible to visually recognize the modified layers 100 and the cracks 110 from the back side 10b of the wafer 10.

Figure 6A:
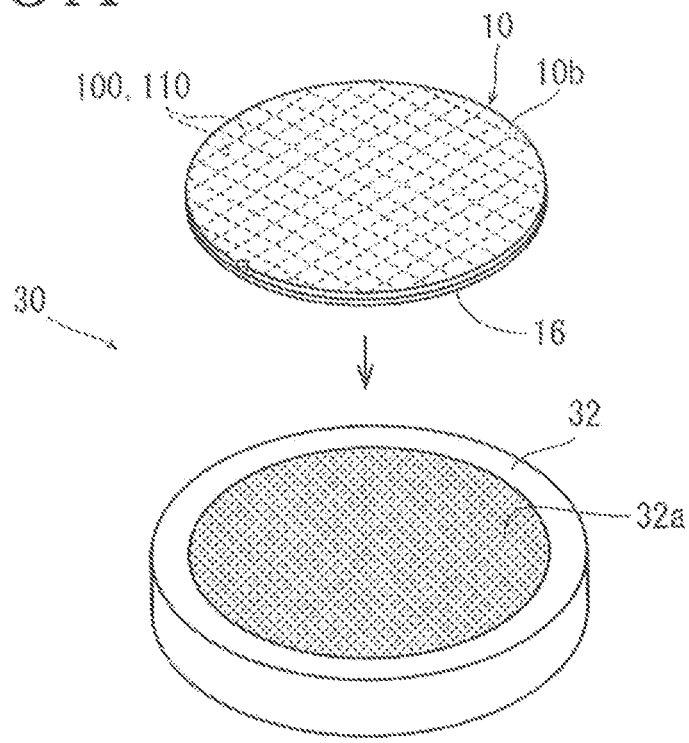
FIG. 6A is a perspective view illustrating a manner in which the wafer is placed on a chuck table of a grinding apparatus.
Figure 6B:
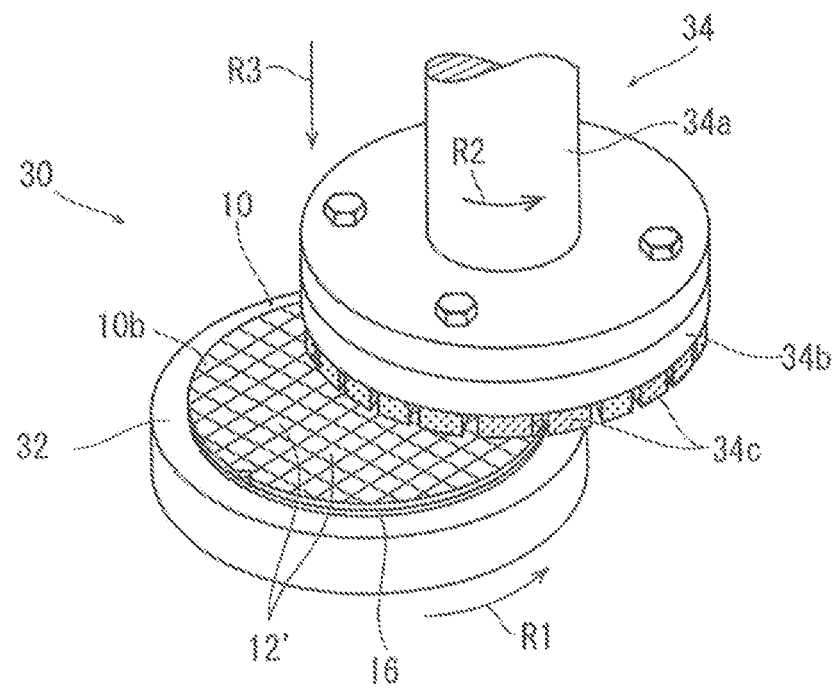
FIG. 6B is a perspective view illustrating a manner in which a dividing step is performed.

After the modified layer forming step is performed in the manner described above, the wafer 10 is unloaded from the chuck table 22 of the laser processing apparatus 20 and transferred to a grinding apparatus 30 partially illustrated in FIGS. 6A and 6B. The wafer 10 is placed on and held under suction by a holding surface 32a of a chuck table 32 of the grinding apparatus 30 such that the back side 10b faces upward and the protective tape 16 faces downward, and the chuck table 32 is positioned below a grinding unit 34 as illustrated in FIG. 6B. The grinding unit 34 includes a rotary shaft 34a driven by an electric motor not illustrated, a grinding wheel 34b disposed on a lower end of the rotary shaft 34a, and a plurality of grinding stones 34c annularly arranged on a lower surface of the grinding wheel 34b.

The chuck table 32 thus positioned below the grinding unit 34 is rotated in a direction indicated by an arrow R1 at a predetermined rotational speed (300 rpm, for example) by operating rotationally driving means not illustrated while, at the same time, the rotary shaft 34a of the grinding unit 34 is rotated in a direction indicated by an arrow R2 at a predetermined rotational speed (6000 rpm, for example). Elevating means not illustrated is then operated to lower the grinding unit 34 in a direction indicated by an arrow R3, to thereby bring the grinding stones 34c into contact with the back side 10b of the wafer 10 while grinding water is supplied to the back side 10b of the wafer 10, so that the back side 10b of the wafer 10 is ground at a predetermined lowering speed (1.0 µm/s, for example) to be thinned. Since the wafer 10 is thinned by the grinding processing, as illustrated in FIG. 6B, the wafer 10 is divided into individual device chips 12' along the division lines 14 along which the modified layers 100 have been formed. A dividing step is then completed.

In the present embodiment, before performing the processing of dividing the wafer 10 into individual device chips 12' by use of the laser processing apparatus 20 and the grinding apparatus 30, the crack detection method including the crack forming step and the crack detecting step is performed as described above. Therefore, it is possible to easily check whether or not the cracks have appropriately been formed without using a microscope or the like, and the laser processing conditions can immediately be adjusted so as to form appropriate cracks, which improves the productivity.

Figure 7:
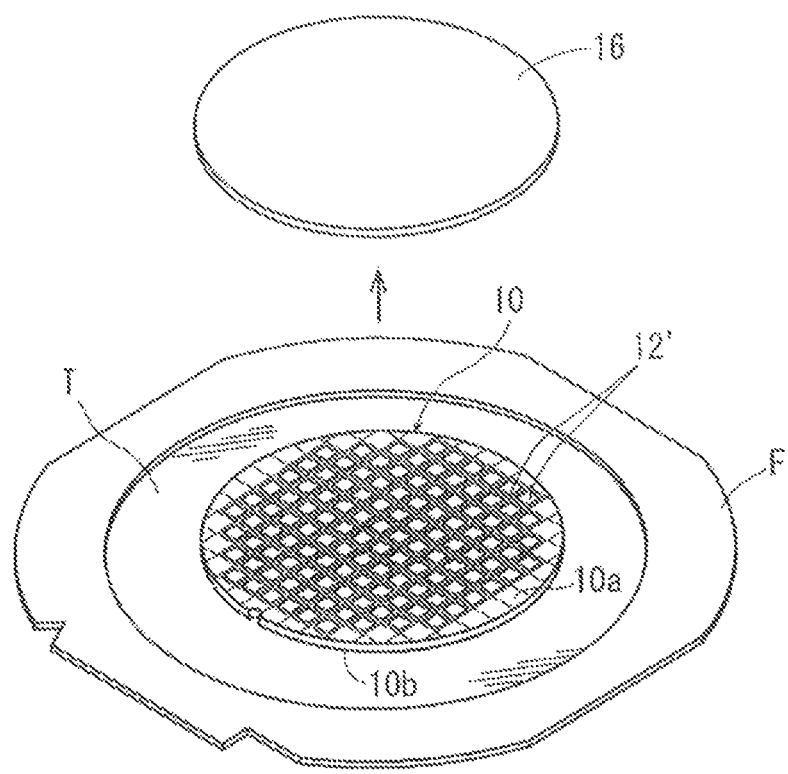
FIG. 7 is a perspective view illustrating a manner in which a tape changing step is performed.

After the dividing step is performed as described above, a tape changing step may be performed as needed so as to peel off the protective tape 16 from the front side 10a of the wafer 10 and to hold the back side 10b of the wafer 10 by an adhesive tape T. In the tape changing step, as illustrated in FIG. 7, an annular frame F having an opening that can accommodate the wafer 10 therein is prepared, the wafer 10 is positioned in the opening of the frame F such that the side of the wafer 10 to which the protective tape 16 is attached faces upward, and the wafer 10 is held by the frame F through the adhesive tape T. With the back side 10b of the wafer 10 attached to the adhesive tape T and held by the frame F, the protective tape 16 is peeled off from the front side 10a of the wafer 10. The wafer 10 that is held by the frame F and has the protective tape 16 peeled off therefrom is housed in an accommodating container (a cassette, for example) not illustrated or directly transferred for a subsequent step (a pick-up step or the like, for example).

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A crack detection method for determining laser processing conditions for a plate-shaped wafer workpiece comprising:
    a crack forming step of applying a laser beam at first conditions to a plate-shaped dummy workpiece that has a first side and a second side opposite to the first side linearly from the first side with a focal point of the laser beam positioned inside the dummy workpiece, the laser beam being of a wavelength having a transmitting property to the dummy workpiece, to thereby form a modified layer inside the dummy workpiece and further form a crack extending from the modified layer toward the second side;
    a coating material applying step of applying a coating material to the second side after the crack forming step is performed; and
    a crack detecting step of detecting the crack visually without a microscope by searching for a portion where the coating material is linearly repelled to determine if a continuous line is visible indicating a continuous crack was formed in the crack forming step;
    adjusting the first conditions if the continuous line is not visible and repeating the cracking forming step, the coating material applying step, and the crack detecting step until the continuous line is formed at the adjusted conditions to obtain determined laser processing conditions to be applied to the wafer workpiece having the same size and composition as the dummy workpiece, wherein the determined laser processing conditions are the first conditions if the continuous line was formed at the first conditions or the adjusted conditions if the continuous line was formed at the adjusted conditions.

2. The crack detection method according to claim 1, wherein an oil-based marker is used in the coating material applying step.

3. The crack detection method according to claim 1 wherein the coating material is colored.

4. The crack detection method according to claim 1 wherein the coating material comprises an oil-based colored coating material, an acrylic coating material, or an india ink.

5. A crack detection method for determining laser processing conditions for a plate-shaped wafer workpiece comprising:
    a crack forming step of applying a laser beam at first conditions to a plate-shaped dummy workpiece that has a first side and a second side opposite to the first side linearly from the first side with a focal point of the laser beam positioned inside the dummy workpiece, the laser beam being of a wavelength having a transmitting property to the dummy workpiece, to thereby form a modified layer inside the dummy workpiece and further form a crack extending from the modified layer toward the second side;
    a coating material applying step of applying a colored coating material to the second side after the crack forming step is performed, wherein the coating material comprises an oil-based colored coating material, an acrylic coating material, or an india ink; and
    a crack detecting step of detecting the crack visually without a microscope by searching for a portion where the coating material is linearly repelled to determine if a continuous line is visible indicating a continuous crack was formed in the crack forming step;
    adjusting the first conditions if the continuous line is not visible and repeating the cracking forming step, the coating material applying step, and the crack detecting step until the continuous line is formed at the adjusted conditions to obtain determined laser processing conditions to be applied to the wafer workpiece having the same size and composition as the dummy workpiece, wherein the determined laser processing conditions are the first conditions if the continuous line was formed at the first conditions or the adjusted conditions if the continuous line was formed at the adjusted conditions.

6. The crack detection method according to claim 5, wherein an oil-based marker is used in the coating material applying step.

7. A crack detection method for determining laser processing conditions for a plate-shaped wafer workpiece comprising:
    a crack forming step of applying a laser beam at first conditions to a plate-shaped dummy workpiece that has a first side and a second side opposite to the first side linearly from the first side with a focal point of the laser beam positioned inside the dummy workpiece, the laser beam being of a wavelength having a transmitting property to the dummy workpiece, to thereby form a modified layer inside the dummy workpiece and further form a crack extending from the modified layer toward the second side;
    a coating material applying step of applying a colored coating material to the second side after the crack forming step is performed, wherein an oil-based marker is used in the coating material applying step; and
    a crack detecting step of detecting the crack visually without a microscope by searching for a portion where the coating material is linearly repelled to determine if a continuous line is visible indicating a continuous crack was formed in the crack forming step;
    adjusting the first conditions if the continuous line is not visible and repeating the cracking forming step, the coating material applying step, and the crack detecting step until the continuous line is formed at the adjusted conditions to obtain determined laser processing conditions to be applied to the wafer workpiece having the same size and composition as the dummy workpiece, wherein the determined laser processing conditions are the first conditions if the continuous line was formed at the first conditions or the adjusted conditions if the continuous line was formed at the adjusted conditions.

* * * * *